(12) United States Patent
Arno et al.

(10) Patent No.: US 6,620,256 B1
(45) Date of Patent: Sep. 16, 2003

(54) NON-PLASMA IN-SITU CLEANING OF PROCESSING CHAMBERS USING STATIC FLOW METHODS

(75) Inventors: Jose Arno, Brookfield, CT (US); Luping Wang, Brookfield, CT (US); Glenn M. Tom, New Milford, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/708,243

(22) Filed: Nov. 8, 2000

Related U.S. Application Data

(63) Continuation-in-part of application No. 09/552,347, filed on Apr. 19, 2000, now Pat. No. 6,343,476, which is a continuation-in-part of application No. 09/300,994, filed on Apr. 28, 1999, now Pat. No. 6,089,027, which is a continuation-in-part of application No. 09/067,393, filed on Apr. 28, 1998, now Pat. No. 6,101,816.

(51) Int. Cl.$^7$ ............................................. C23G 5/028
(52) U.S. Cl. ........................... 134/2; 134/21; 134/22.1; 134/31; 427/248.1
(58) Field of Search ............... 134/2, 21, 22.1, 134/31; 427/248.1

(56) References Cited

U.S. PATENT DOCUMENTS

| | | |
|---|---|---|
| 1,659,263 A | 2/1928 | Harris |
| 1,679,826 A | 8/1928 | Jenkins |
| 2,047,339 A | 7/1936 | Thomas |
| 2,354,283 A | 7/1944 | St. Clair |
| 2,502,588 A | 4/1950 | Preston et al. ............... 62/48.1 |
| 2,553,486 A | 5/1951 | Thomas ...................... 62/48.1 |
| 2,615,287 A | 10/1952 | Senesky |
| 2,707,484 A | 5/1955 | Rush ......................... 62/48.1 |
| 2,793,504 A | 5/1957 | Webster |
| 3,388,962 A | 6/1968 | Baumann et al. |
| 3,590,860 A | 7/1971 | Stenner |
| 3,699,998 A | 10/1972 | Baranowski, Jr. |
| 3,791,412 A | 2/1974 | Mays |
| 3,972,346 A | 8/1976 | Wormser |
| 3,994,674 A | 11/1976 | Baumann et al. |
| 4,173,986 A | 11/1979 | Martin |
| 4,485,739 A | 12/1984 | Emmett ....................... 102/200 |
| 4,624,443 A | 11/1986 | Eidsmore ..................... 251/65 |
| 4,694,860 A | 9/1987 | Eidsmore ............... 137/614.21 |

(List continued on next page.)

OTHER PUBLICATIONS

U.S. patent application Ser. No. 09/067,393, Wang et al., filed Apr. 28, 1998.
U.S. patent application Ser. No. 09/300,994, Wang et al., filed Apr. 28, 1999.
ANSI/CGA V–1–1994 American National/Compressed Gas Association, Standard for Compressed Gas Cylinder Valve Outlet and Inlet Connections, Compressed Gas Assoc., Inc.
Integrated Flow Systems Inc., SR4 and SR3 Series Regulators with Operation Features, 1700 Granite Creek Road, Santa Cruz, CA 95065, (no date available).

*Primary Examiner*—Timothy Meeks
(74) *Attorney, Agent, or Firm*—Margaret Chappuis; Marianne Fuierer

(57) ABSTRACT

An improved, non-plasma, static method for removing accumulated films and solid residues from interior surfaces of processing chambers used in thermal or plasma CVD treatment processes. The method includes introducing a reactive substance into a processing chamber while adjusting the pressure within the processing chamber to a predetermined level. The flow of the reactive substance into the processing chamber is terminated and the reactive substance is retained in the processing chamber to react with solid residues and form reaction products, following which the reaction products are subsequently removed from the processing chamber. Advantageously, terminating the flow of reactive substance into the processing chamber results in etching action that more effectively utilizes the cleaning agent and generates less hazardous materials.

20 Claims, 9 Drawing Sheets

U.S. PATENT DOCUMENTS

| | | | |
|---|---|---|---|
| 4,744,221 A | 5/1988 | Knollmueller | 62/48.1 |
| 4,793,379 A | 12/1988 | Eidsmore | |
| 4,836,242 A | 6/1989 | Coffre et al. | |
| 5,230,359 A | 7/1993 | Ollivier | |
| 5,233,837 A | 8/1993 | Callahan | 62/606 |
| 5,289,690 A | 3/1994 | Rockenfeller et al. | 62/77 |
| 5,303,734 A | 4/1994 | Eidsmore | 337/305.43 |
| 5,380,370 A * | 1/1995 | Niino et al. | 134/2 |
| 5,409,526 A | 4/1995 | Zheng et al. | |
| 5,518,528 A | 5/1996 | Tom et al. | |
| 5,547,229 A | 8/1996 | Eidsmore | 285/93 |
| 5,566,713 A | 10/1996 | Lhomer et al. | |
| 5,595,209 A | 1/1997 | Atkinson et al. | 137/116.5 |
| 5,645,192 A | 7/1997 | Amidzich | |
| 5,673,562 A | 10/1997 | Friedt | 62/48.1 |
| 5,678,602 A | 10/1997 | Cannet et al. | |
| 5,685,159 A | 11/1997 | Kooy et al. | 62/50.1 |
| 5,692,381 A | 12/1997 | Garrett | 62/60 |
| 5,694,975 A | 12/1997 | Eidsmore | 137/489.5 |
| 5,752,544 A | 5/1998 | Yves | 137/461 |
| 5,762,086 A | 6/1998 | Ollivier | 137/1 |
| 5,901,557 A | 5/1999 | Grayson | 62/45.1 |
| 5,937,895 A * | 8/1999 | Le Febre et al. | 137/494 |
| 6,007,609 A | 12/1999 | Semerdjiian et al. | |
| 6,211,081 B1 * | 4/2001 | Mikata | 427/248.1 |
| 6,410,102 B1 * | 6/2002 | Hashizume et al. | 427/534 |

* cited by examiner

NON-PLASMA IN-SITU CLEANING OF PROCESSING CHAMBERS USING STATIC FLOW METHODS

CROSS-REFERENCE TO RELATED APPLICATIONS

This is a continuation-in-part of U.S. patent application Ser. No. 09/552,347 filed on Apr. 19, 2000 now U.S. Pat. No. 6,343,476, in the names of Luping Wang and Glenn M. Tom for "GAS STORAGE AND DISPENSING SYSTEM COMPRISING REGULATOR INTERIORLY DISPOSED IN FLUID CONTAINMENT VESSEL AND ADJUSTABLE IN SITU THEREIN," which is a continuation-in-part of U.S. patent application Ser. No. 09/300,994 filed on Apr. 28, 1999 in the names of Luping Wang and Glenn M. Tom for "FLUID STORAGE AND GAS DISPENSING SYSTEM," now U.S. Pat. No. 6,089,027; which is a continuation-in-part of U.S. patent application Ser. No. 09/067,393 filed Apr. 28, 1998 in the names of Luping Wang and Glenn M. Tom for "FLUID STORAGE AND GAS DISPENSING SYSTEM," now U.S. Pat. No. 6,101,816.

BACKGROUND OF THE INVENTION

1. Field of the Invention

The present invention relates to methods and apparatus for removing accumulated material deposits, e.g., film deposits, from processing chambers, and more particularly, to non-plasma in-situ cleaning of interior surfaces of semiconductor processing chambers.

2. Description of the Related Art

In the processing of a semiconductor wafer, to form integrated circuit structures therein, it is desirable to deposit materials including, for example, tungsten (W), titanium (Ti), tantalum (Ta), polysilicon, and/or silicon nitride on the wafer by a chemical vapor deposition (CVD) process. Chemical vapor deposition may occur by a conventional thermal CVD process, which involves supplying reactive gases to a substrate surface where heat induced chemical reactions (homogenous and heterogeneous) take place to produce a desired film. In the alternative, a plasma process may be implemented wherein a controlled plasma is formed to decompose and/or energize reactive species to produce the desired film.

Whether utilizing the thermal or plasma CVD process, thin films of deposited materials accumulate in the interior of the CVD deposition chamber. As a result, these thin film deposits must be removed periodically because they tend to affect the reproducibility of thin film deposition processes by changing the dimensions of the chamber. Also, the thin film deposits can flake off and contaminate the wafer being processed in the chamber.

In the current state of the art, it is conventional to remove such deposits using several different cleaning methods, including wet cleaning and in-situ cleaning.

The wet cleaning method necessitates the need for breaking the processing chamber's vacuum seal and manually wiping down the chamber's interior surfaces. Strong acid solutions are often used to dissolve the deposits on the interior surface of the chamber. Upon completion of the cleaning process, the chamber must be reassembled and resealed.

Inherent problems associated with this approach include the high volumes of hazardous chemicals that must be used in the cleaning process. Additionally, the manual breakdown of the processing system and subsequent reassembly is labor-intensive, time-consuming, increases wear on the processing chamber components, and may leave residual contamination within the chamber.

An in situ cleaning process is performed without disassembly of the process chamber. Typically, either plasma is generated for a dry etching process or a gaseous agent is flowed through the process chamber to remove accumulated films.

A plasma-enhanced cleaning process operates by introducing a continuous stream of gaseous fluorinated molecules, such as $CF_4$, $NF_3$, $C_2F_6$, $C_3F_8$, $SF_6$ into a vacuum deposition chamber. A plasma is then ignited in the chamber during the gas flow, by connecting to a high frequency (radio or microwave) field. The increased energy creates atomic fluorine which promotes a reaction between the cleaning gas and any residue accumulated on the interior surfaces of the processing chamber.

While this process satisfactorily removes residues, the plasma physics require the continuous flow of large quantities of highly fluorinated gaseous molecules to maintain the plasma. In turn this generates highly reactive atomic radicals in the presence of the high frequency field. These reactive radicals lead to excessive amounts of extremely reactive and hazardous air pollutants, such as $F_2$ and HF. Additionally, these plasma reactions are often only 40% efficient in the destruction of any perfluorinated compounds (PFC) gases that may form which are known to have a global warming potential (GWP) at least three times more powerful than $CO_2$, and a lifetime of several thousands years in the atmosphere.

Another in situ method to remove residues from process chambers involves the introduction of a continuous flow of voluminous amounts of hazardous materials, such as HF or interhalogens, which also pose a significant risk to humans and the environment.

U.S. Pat. No. 4,498,953 describes an in-situ cleaning method in which an interhalogen, such as $BrF_5$, $BrF_3$, $ClF_3$, or $IF_5$ is continuously flowed through the processing chamber while maintaining a predetermined pressure within the chamber. At the end of the treatment, the flow of the interhalogen gas is terminated. However, a significant amount of hazardous material is moved through the system. Clearly, the high volume of material utilized in this method not only increases the cost of production but presents ancillary costs relating to the disposal of hazardous materials.

A similar problem exists in the process disclosed in U.S. Pat. No. 5,565,038 wherein a continuous flow of an interhalogen gas is introduced into a processing chamber to be used as a cleaning agent. Again, the flow of reactive gas is ongoing, and not terminated until the film removal is completed. Still further, as in the prior art cited above, this method is inherently problematic because of the large quantities of hazardous materials that are utilized, and the associated costs to the manufacturer and/or the environment. Additionally, the continuous flow cleaning process is performed under very low pressure and cleaning efficiency is reduced under such condition.

Other known methods for removing deposit buildup in processing chambers utilize $NF_3$, including the types used in thermal CVD processes such as, vertical tubes. However, very high temperatures are required to crack $NF_3$, to release the reactive fluorine ions. If these temperatures are not reached and/or maintained, hazardous $NF_3$ is exhausted to the surrounding environment. In addition, the poor reaction selectivity of fluorine ions results in unwanted etching of the quartz reactor. Still further, depending on the shape of the processing chamber, uniform cleaning is not always predictable or accomplished.

Accordingly, it would be desirable to provide an improved cleaning process for deposit removal in a processing chamber, without the disadvantages of generating highly reactive radicals that may subsequently form perfluorinated greenhouse gases and/or using voluminous quantities of hazardous material thereby increasing production costs, disposal costs, and exposure risks to personnel.

SUMMARY OF THE INVENTION

It is a principal object of the present invention to provide an improved non-plasma cleaning method for removing deposits in a chemical vapor deposition chamber, utilized in either a plasma or thermal process, that reduces the volume of etching gas used in the cleaning method.

Another object of the present invention is to provide an improved non-plasma cleaning method that introduces a sufficient amount of an etching gas into a chemical vapor deposition chamber to effectively remove deposits therein with reduced production costs.

Still another object of the present invention is to provide an improved non-plasma cleaning method that does not generate unnecessary amounts of hazardous waste materials.

Yet another object of the present invention is to provide an improved non-plasma cleaning method that operates at higher pressures thereby increasing speed of the reaction rate.

A further object of the present invention is to provide an improved non-plasma cleaning method that operates at higher temperature thereby increasing the efficiency of the cleaning agent.

A still further object of the present invention is to provide an improved non-plasma cleaning method that uses reduced volumes of etching material but with increased utilization rates.

In one aspect, the present invention relates to a method for removing solid residue from interior surfaces of a processing chamber, by introducing a reactive substance into the interior of the processing chamber. The pressure is adjusted in the processing chamber to a predetermined level. When the pressure is adjusted, the introduction of the reactive substance into the processing chamber is terminated or substantially discontinued. The reactive substance is retained in the processing chamber for a sufficient time to react with the solid residue and form reaction products. The reaction products are subsequently removed from the processing chamber.

The non-plasma cleaning method disclosed herein may use any reactive substance that will react with the surface deposits to form a reaction product. Preferably, the reactive substance is a halogenated substance having at least one halogen substituent, e.g., F, Cl, Br, and I. The halogenated substance may be introduced into the interior of the processing chamber in an mount sufficient to increase the pressure in the vessel to a predetermined value, so that advantageously, no additional amount of the halogenated substance needs to be introduced into the processing chamber. As a result, the static method of the present invention provides unexpectedly superior results compared to continuous flow methods, and significantly reduces the amount of halogenated substance necessary for removing deposits within the processing chamber.

In another aspect, the present invention relates to a non-plasma cleaning process wherein internal pressures in the processing chamber are higher than those used in the prior art, thereby allowing a smaller amount of a halogenated substance to be more effective during the cleaning process while not reducing selectivity of the process.

The methods of the present invention may be used as an intermittent step or an in-situ step in an ongoing plasma etch process. Moreover, the cleaning methods can be employed with random non-disruptive frequency so as to prevent the accumulation of flaking residues that would otherwise inevitably result in contamination of the plasma etching process.

Accordingly, the present invention in one embodiment relates to a method for routinely controlling residue during CVD processing, either plasma or thermal, of a workpiece, comprising:

a) providing a processing apparatus including a processing chamber and a source of energy, either electrodes or thermal heat;

b) introducing a semiconductor workpiece into the processing chamber;

c) introducing a reactive gas into the processing chamber suitable for forming solid residues for deposition on the workpiece and interior surfaces of the processing chamber;

d) supplying energy in a sufficient amount to generate vapor deposition conditions;

e) removing the workpiece from the processing chamber; and f) cleaning the interior surfaces of the processing chamber, comprising the steps of:
   1) introducing into the interior of the processing chamber at least one halogenated substance capable of effectively reacting with the solid residue, the halogenated substance being in a sufficient amount to increase pressure within the processing chamber to a preset pressure level at a preset temperature; 2) discontinuing the flow of the halogenated substance into the interior of the processing chamber; 3) retaining the halogenated substance in the processing chamber for a sufficient time to effectively react with at least a portion of the solid residue to form at least one gaseous product; and 4) removing from the interior of the processing chamber the gaseous product and any remaining unreacted halogenated substance. Preferably, the preset temperature and pressure is maintained within the processing chamber during retention of the halogenated substance to increase the efficiency of the cleaning process.

In still another aspect, the present invention relates to applying the above described cleaning method wherein the halogenated substance is introduced into the chamber via a dispensing system that minimizes potential risks of leakage and/or malfunctioning regulator assemblies as disclosed in U.S. Pat. Nos. 6,101,816 and 6,089,027, and co-pending U.S. patent application Ser. No. 09/552,287 filed on Apr. 19, 2000, the disclosures of which hereby are incorporated herein by reference in their entirety.

In this regard, the present invention relates to a method of delivery of a reactive substance, in a gaseous phase, to the processing chamber from a fluid storage and gas dispensing system that provides additional safety measures for safe delivery of the reactive substance. Specifically, a method for fluid delivery of a gaseous reactive substance for cleaning a processing chamber comprises:

containing a reactive substance, in a fluid phase, in a confined state against at least one fluid pressure regulator in a fluid flow path closed to fluid flow downstream of the fluid pressure regulator, without flow control means between said fluid and said fluid pressure regulator;

selectively dispensing the confined fluid by opening the fluid flow path to fluid flow downstream of the fluid pressure regulator, and discharging fluid at a rate determined by the fluid pressure regulator; and using the discharged fluid in the cleaning of a processing chamber.

The fluid delivery and gas dispensing system comprises:

a fluid storage and dispensing vessel enclosing an interior volume for holding a fluid, wherein the vessel includes a fluid flow port;

a fluid dispensing assembly coupled in fluid flow communication with the port;

at least one fluid pressure regulator associated with the port and arranged to maintain a predetermined pressure in the interior volume of the vessel;

the fluid dispensing assembly being selectively actuatable to flow gas, deriving from the fluid in the interior volume of the vessel, through the fluid pressure regulator and fluid dispensing assembly, for discharge of the gas from the vessel.

The fluid pressure regulator is preferably a double stage fluid pressure regulator system comprising two regulators, a high pressure stage regulator in contact with the liquid in the vessel and a low pressure stage regulator in fluid communication with the high pressure stage regulator. The double stage regulator system is preferred to reduce the possibility of leakage of contained fluid, e.g., internal liquids, particularly when the vessel is reposed on its side and the liquid inside exceeds a certain level. Fundamentally, the double stage regulator system provides a two-gate system, through which any fluid must pass before leakage can occur. If a small amount of fluid passes through the first gate, it will not be able to pass through the second gate because of the pressure difference, thereby preventing any unwanted leakage if the fluid storage and dispensing vessel is oriented in a horizontal position or otherwise tips over during its deployment.

Although the fluid pressure regulator, either a single or double stage system, may be positioned exteriorly, it is preferred that it is positioned interiorly in the fluid storage and dispensing vessel, so that it is protected by the vessel, e.g., cylinder casing or housing, from impact, environmental exposure and damage.

A still further aspect of the fluid dispensing system relates to the fluid storage and dispensing vessel discussed hereinabove containing a physical absorbent material having adsorbed thereon a gas at an internal pressure in the vessel, and a gas dispensing assembly coupled with the vessel and selectively operable to dispense gas from the vessel. The gas in the vessel may for example be at any suitable pressure, subatmospheric (e.g., 20–700 torr), atmospheric or superatmospheric (e.g., from about 50 psig to about 5000 psig).

The above and other aspects and advantages of the invention will become apparent from the following more detailed description, taken in conjunction with the accompanying drawings.

DETAILED DESCRIPTION OF THE INVENTION AND THE PREFERRED EMBODIMENT THEREOF

In accordance with the present invention, deposits and/or solid residues, remaining in a processing chamber after a CVD process, are removed from interior surfaces of the processing chamber. The removal process is accomplished by introducing a reactive substance, preferably a halogenated substance, into the processing chamber in a sufficient amount to increase the pressure within the chamber to a predetermined level at a predetermined temperature. Introduction of the reactive substance is discontinued and the reactive substance is maintained within the system for a sufficient time for the reactive substance to react with the solid residue therein and form a reaction product, preferably gaseous, to be removed from the system.

Figure 1:
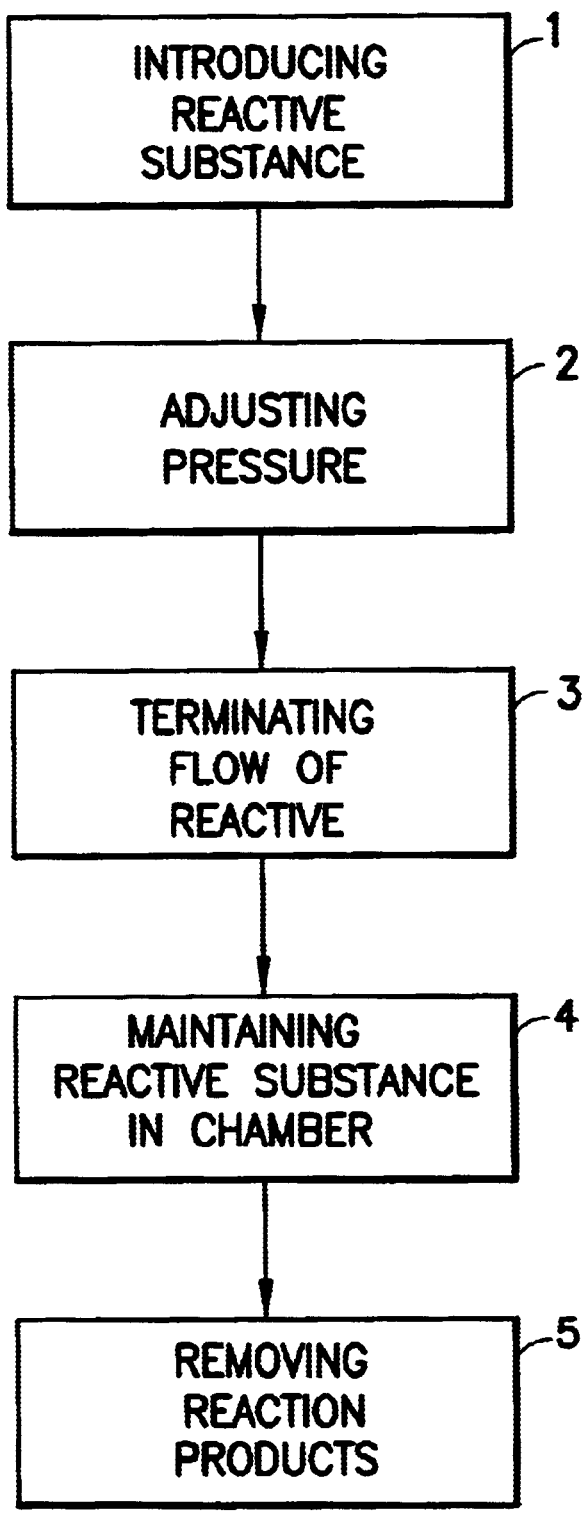
FIG. 1 is a block diagram showing the individual steps of removing solid residue from a processing chamber according to one embodiment of the present invention.

The buildup of deposits on the interior surfaces of the processing chamber is removed by first introducing at least one halogenated substance into the processing chamber as shown in FIG. 1. Generally, any halogenated substance, that has selectivity for the solid residues or deposits and is in a gaseous state at the temperature and pressure conditions within the processing chamber, may be used in the cleaning process. For example, suitable halogenated substances that produce the desired selectivity include, without limitation, $F_2$, $Cl_2$, $Br_2$, HF, HCl, HI, HBr, ClF, BrF, BrCl, ICl, IBr, $ICl_3$, $BrF_5$, $BrF_3$, $ClF_3$, $IF_5$, $IF_7$, $XeF_2$, $NF_3$, $SF_6$, $SiCl_4$, $CF_4$, $C_2F_6$, $C_3F_8$ and combinations thereof. Preferably, fluorinated substances are used as cleaning agents, and more preferably $F_2$.

The halogenated substance may be stored either as a liquid or gas, but during the cleaning process the halogenated substance is preferably in a gaseous state thereby providing sufficient contact with all surface areas within the processing chamber.

The halogenated substance that is introduced into the processing chamber can be pure or mixed with other gaseous components, such as an inert gas or oxidant gas.

An inert gas is defined as a gas that does not substantially react with the halogenated substance or the deposits, and may include gases, such as Ar, He, $N_2$ and the like.

The halogenated substance may further comprise an oxidant gas, such as oxygen containing gases including, without limitation, $O_2$, $O_3$, $H_2O$, $H_2O_2$ and the like. All of these oxidants are highly reactive and have the ability to decompose polymeric-based contaminating films or particles such that they are more easily removed from surfaces within the chamber. As a result, the inclusion of an oxidant gas can increase the speed of the cleaning process.

Necessarily, if the halogenated substance is mixed with either an inert gas or an oxidizing gas, the gaseous halogenated substance is in an amount equal to or greater than the inert or oxidizing gas. Thus, if a mixture of gases is used, the gaseous halogenated substance must be introduced at a greater rate than the other gases in the mixture.

The halogenated substance may be introduced into the chamber at any flow rate that provides sufficient infusion of the gaseous halogenated substance into the chamber to increase the pressure within the chamber to a predetermined level. Preferably, the introduction rate of the halogenated substance ranges from about 10 to about 10,000 standard cubic centimeters per minute (sccm) to effect a pressure within the processing chamber within a range from about 1 torr to about 760 torr, and more preferably, from about 200 torr to about 500 torr.

The total amount of a gaseous halogenated substance introduced into the process vacuum chamber, for optimal performance of the cleaning methods disclosed herein, will vary somewhat depending upon the size of the chamber and pressure required within the chamber. A practitioner skilled in the art will be able to adjust the process parameters to achieve the best results of the present invention.

Preferably, a sufficient amount of the halogenated substance is introduced into the chamber to react with the surface deposits, and more preferably, at least a stoichiometric amount to form gaseous reaction products. The stoichiometric amount will depend on the constituents of the surface deposits, e.g. if the deposit is tungsten, at least three moles of fluorine are needed to form a gaseous reaction product, as shown below:

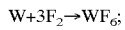

$W + 3F_2 \rightarrow WF_6$;

If the cleaning gas is to be vaporized from a liquid halogenated substance, a delivery gas, such as helium, may be bubbled through a bubbler assembly along with the liquid halogenated substance at the appropriate temperature and pressure to obtain the desired gas flow rates for introduction into the vacuum chamber.

This invention contemplates processes that include introducing a second gas, subsequent to the static cleaning process of the present invention, such as an inert gas and/or oxygen to purge any remaining halogenated substances from the interior of the chamber.

Although the temperature may vary over a large range, generally the temperature is adjusted to increase etching rates and a skilled practitioner will be able to adjust the temperature parameters of the process to achieve the results of the present invention. Typically, the preferred temperature range is from about 60° C. to about 1000° C., and more preferably, from about 250° C. to about 600° C. and dependent upon the predetermined pressure within the vacuum chamber.

After a sufficient amount of the gaseous halogenated substance is introduced into the processing chamber and the predetermined pressure is reached, the flow of the gaseous halogenated substance is terminated.

It should be noted that the predetermined internal pressure of the vacuum processing chamber may be accomplished by several methods. The vacuum processing chamber may be vacated to reduce the internal pressure to less than 1 torr and then filled with a sufficient amount of gaseous halogenated substance to reach the appropriate predetermined pressure. Alternatively, a predetermined amount of gaseous halogenated substance may be introduced into the processing chamber and the pressure adjusted accordingly.

In certain circumstances, a semi-static method may be appropriate involving the release of gases from the processing chamber. The semi-static method, according to the present invention, involves filling the chamber with a highly reactive substance to a pre-set pressure, and opening a post pump valve to allow continuous slow removal of gases from the processing chamber which may include gaseous reaction products. It is further contemplated that a slow flow of the highly reactive substance, into the chamber, can be maintained or introduced on an intermittent basis. The pressure within the processing chamber is adjusted, according to the release of gases, to maintain high reaction efficiencies.

The gaseous halogenated substance, acting as a cleaning and etching agent, is maintained in the chamber for a sufficient time to react with the surface deposits and form gaseous reaction products. Unexpectedly, it was discovered that the removal of the surface deposits in the processing chamber is efficiently performed by discontinuing the flow of halogenated substances. This is in marked contrast to the methods of the prior art that maintain a continuous flow of a cleaning agent during the entire cleaning treatment. Moreover, it has been discovered that the cleaning efficiency per liter of cleaning agent is greatly enhanced by the static flow methods of the present invention when compared to the continuous flow methods of the prior art.

It is further contemplated by the inventors that the internal pressure within the processing chamber may be alternated between high and low pressures, to enhance cleaning. For instance, a high pressure, relative to the processes normally run in the processing chamber, can be 700 torr and the low pressures can be 50 torr.

The time period during which the gaseous halogenated substance is maintained within the processing chamber depends on the thickness of the deposits or residues in the chamber as well as the pressure and temperature within the chamber. Usually, the time will be within a range from about 15 seconds to about 15 minutes per micron of thickness of deposited material on the interior surfaces. Those skilled in the art will be able to adjust the time parameter of the process to achieve the results of the present invention.

Figure 2:
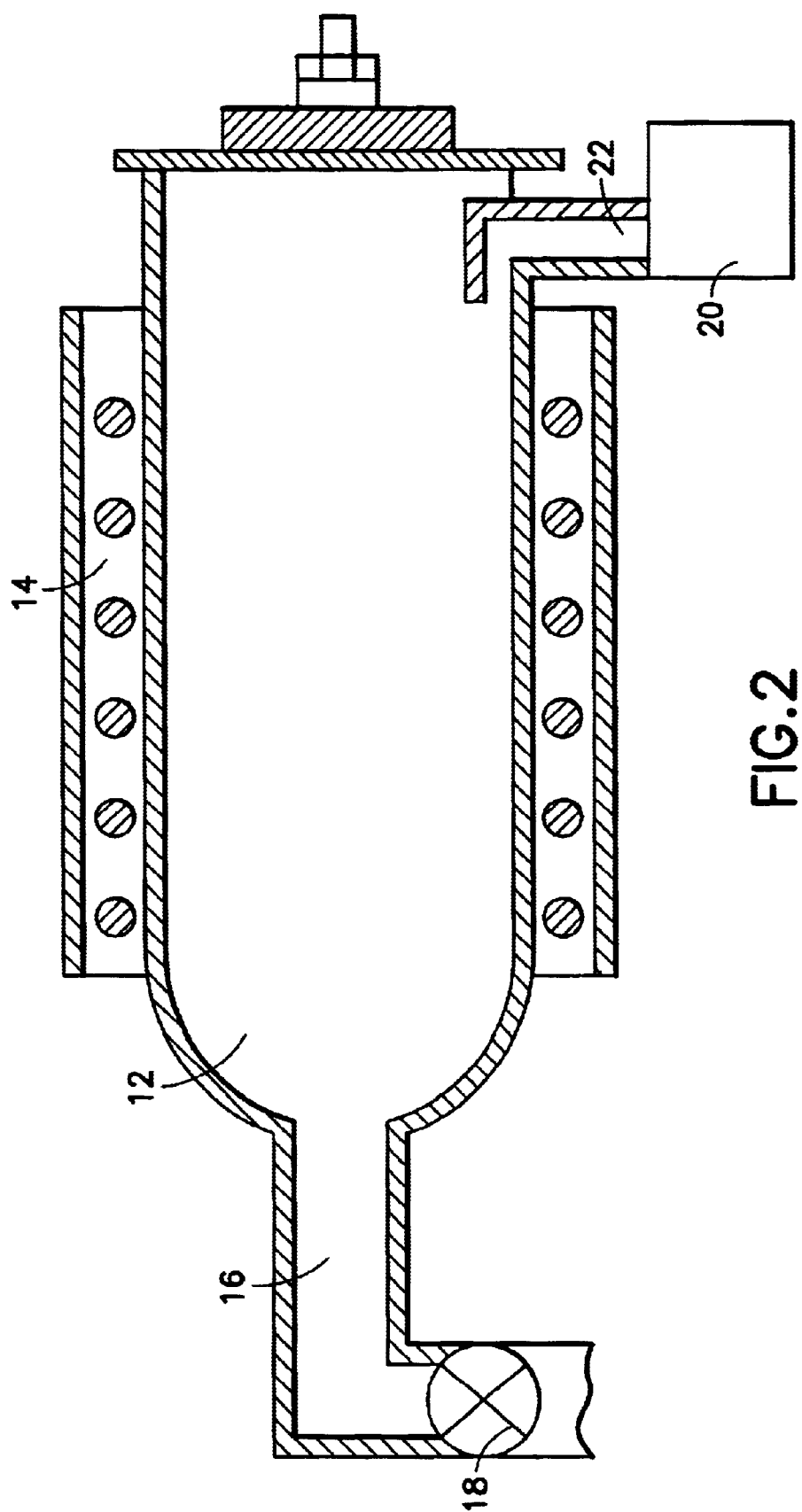
FIG. 2 is a simplified diagram of a processing system that may be used in various cleaning methods in accordance with the present invention.

FIG. 2 illustrates one embodiment of a vacuum processing system 10 used in a thermal chemical vapor deposition (CVD) process. It should be noted that any type of CVD processing chamber may be cleaned by the methods of the present invention including, thermal and plasma chambers in any shape or size, such as vertical tubes, horizontal reactors and other vessels known to those skilled in the art. The CVD system in this illustrative embodiment contains a quartz reaction vacuum processing chamber 12 in which a cleaning process, according to the method of the present invention, may be practiced. Surrounding the processing chamber 12 is an annular heater 14 utilized in the CVD process, and if preferred, during the cleaning methods of the present invention. This system employs an outlet conduit 16 having therein a throttle valve 18 to control the pressure within the chamber. A vacuum pump, (not shown) may be positioned downstream of the throttle valve 18. A gas detector may be added to the processing system to sense a product gas to help determine completion of the cleaning process.

Gas from a supply tank 20 is introduced via conduit 22 into the processing chamber. Any delivery apparatus may be used to deliver and introduced the gaseous halogenated substance into the processing chamber known to those skilled in the art.

Preferably the supply tank 20 is a fluid storage and gas dispensing system of a type as more fully disclosed and described in U.S. Pat. Nos. 6,089,027; and 6,101,816; and co-pending U.S. patent application Ser. No. 09/552,287 filed on Apr. 19, 2000.

The preferred apparatus for delivery of a gaseous halogenated substance is briefly discussed with reference to FIG. 3.

The fluid storage and gas dispensing system 20 includes a storage and dispensing vessel 52 including a cylindrical side wall 54, a bottom floor 56 and an upper neck portion 58, defining an enclosed interior volume 60 holding the fluid 62. Fluid 62 may be any suitable fluid medium at any appropriate fluid storage conditions, e.g., a high-pressure gas, liquid, gas or alternatively a liquid, to be dispensed as a gas. Suitable fluids include the halogenated substances herein discussed above, and others that have utility in semiconductor manufacturing operations as halide etchants, cleaning agents, source reagents, etc.

Preferably, fluid 62 is maintained under sufficient pressure in vessel 52 so as to remain in a liquid phase.

Disposed in the upper neck portion 58 of the vessel 52 is a valve head assembly comprising valve 64 communicating with valve outlet 66, from which vapor is dispensed from the vessel in the direction indicated by arrow A.

The valve 64 is shown with an associated actuator 68, which may be of any suitable type (electrical, pneumatic, etc.) as desired in the given end use application of the invention. Alternatively, the valve 64 may be manually actuated, or provided with other flow control means.

The valve 64 is joined in gas flow communication with a pressure regulator 70, which is of a conventional type employing a poppet element which may for example be spring biased in a closed condition and wherein the poppet is subject to displacement when the pressure differential across the poppet element exceeds a certain level. The pressure regulator 70 may for example be set to a subatmospheric, atmospheric or superatmospheric pressure value, e.g., 700 torr. The specific pressure level is chosen with respect to the liquid or other fluid contained in the vessel, as appropriate to the storage and dispensing operation.

Coupled with the pressure regulator 70 is a phase separator 72 including a membrane element 74, which is permeable to gas or vapor deriving from the liquid 62, but is impermeable to the liquid itself.

The phase separator 72 is preferably fabricated from a vapor/gas-permeable, liquid-impermeable membrane that transmits only the gas or vapor from the liquid but precludes liquid flow therethrough. The membrane may in practice be formed of a wide variety of potentially useful materials, including, for example, polypropylene, polyvinylidene fluoride, polytetrafluoroethylene, polyfluoroacetate, silicone, and surface-treated glass fabrics. One preferred useful material comprises polyvinylidene fluoride "breathable" fabrics such as those commercially marketed under the trademark "Gore-Tex®" (Gore-tex Corporation). Other commercially available materials for use as membrane phase separator materials include Noryl film (General Electric Company, Pittsfield, Mass.).

Figure 3:
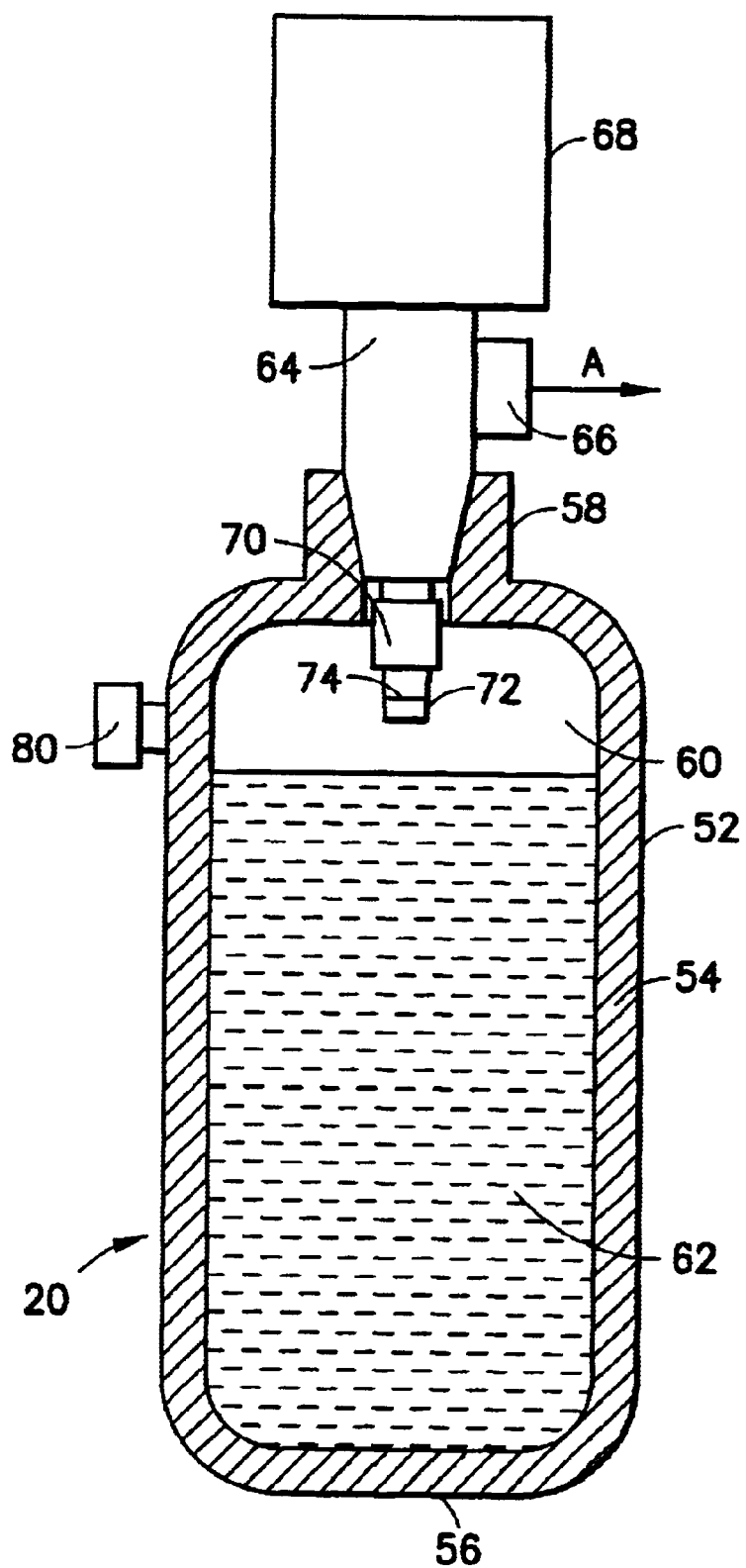
FIG. 3 is a cross-sectional view of a fluid storage and gas dispensing system according to the present invention, as arranged to be communicatively connected to the processing system for delivery of cleaning gas.

In use of the fluid storage and gas dispensing system of FIG. 3, the fluid 62 is stored at a predetermined pressure ensuring its liquidity. For this purpose, the pressure regulator 70 is set at a predetermined level ensuring the appropriate interior pressure in the interior volume 60 of the vessel.

When it is desired to dispense gas from the vessel 52, the valve actuator 68 is actuated to open valve 64, thereby permitting gas or vapor deriving from the fluid to flow through the permeable membrane 74, the pressure regulator 70 and the valve 64, for egress from the valve head dispensing assembly through outlet 66.

The opening of the valve 64 effects a reduction of the pressure on the discharge side of the permeable membrane 74 and causes permeation of vapor through the membrane, for discharge. At the same time, the fluid pressure regulator will maintain the pressure of the gas being dispensed at the set point pressure level.

The vessel 52 may be equipped with a separate fill port 80 (in relation to the fluid flow port at the neck of the vessel), and such separate fill port may be coupled to a source of fluid for filling of the vessel.

Alternatively, the vessel may simply be provided with one neck opening, with the pressure regulator set at an appropriate temperature level for filling. In the filling operation, the vessel may be chilled, as by placement of the vessel in a cryostat or coolant bath, to reduce the temperature of the vessel below the point of the predetermined pressure established by the pressure regulator. The fluid pressure regulator then will have a gas pressure in the interior volume 60 of the vessel which is below the set point of the regulator, thereby allowing the poppet element of the pressure regulator to disengage from its seat and allow ingress of fluid to the vessel, for subsequent storage of the fluid therein.

Figure 8:
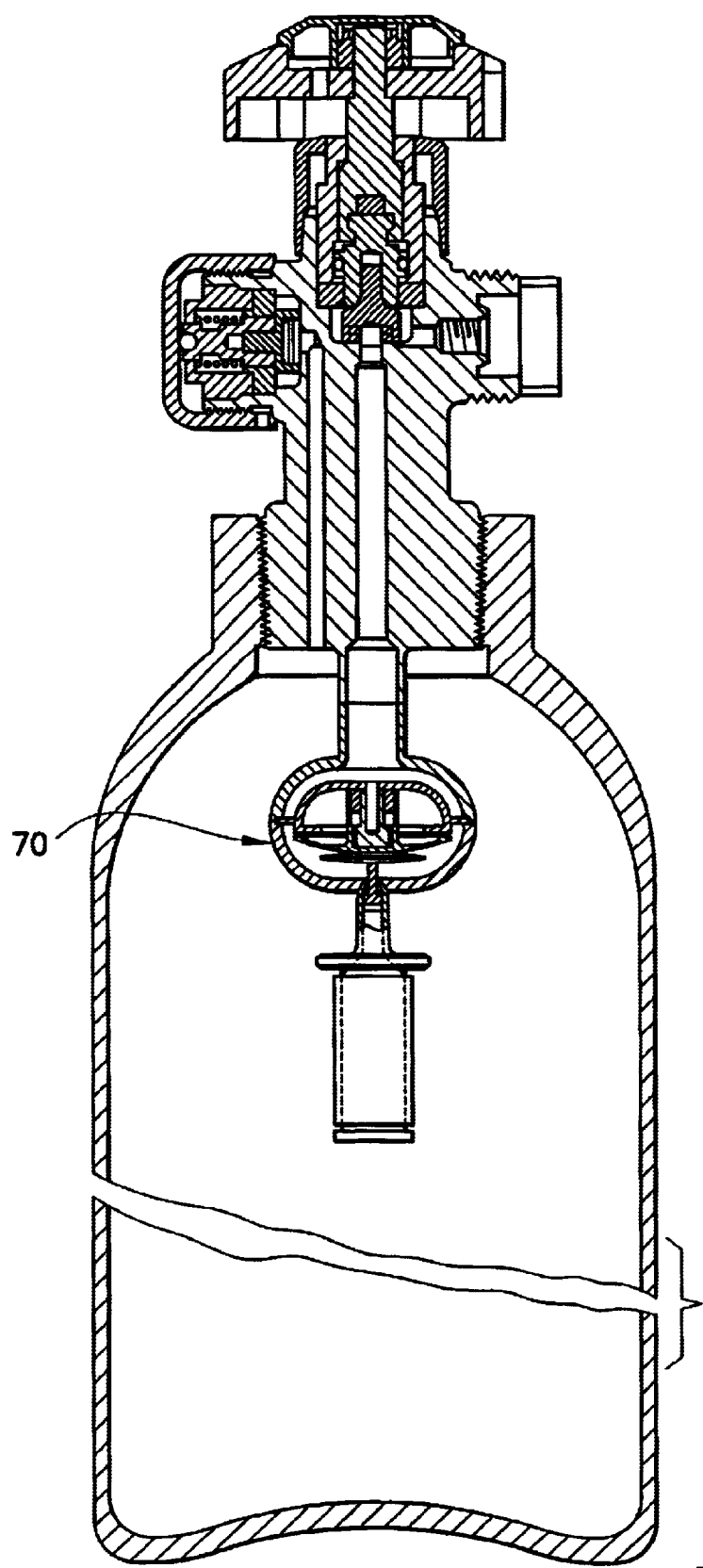
FIG. 8 is a cross-sectional view showing a fluid delivery and gas dispensing system having a single regulator.

The fluid pressure regulator 70 may be interiorly disposed in the interior volume of the fluid storage and dispensing vessel as shown in FIG. 8 having corresponding numbers to FIG. 3. In use, the interiorly disposed gas pressure regulator is protected from impact as well as environmental exposure, which could otherwise deleteriously affect the structural integrity or operation of the vessel, as well as constituting an additional potential leak path for the storage and dispensing vessel.

Figure 9:
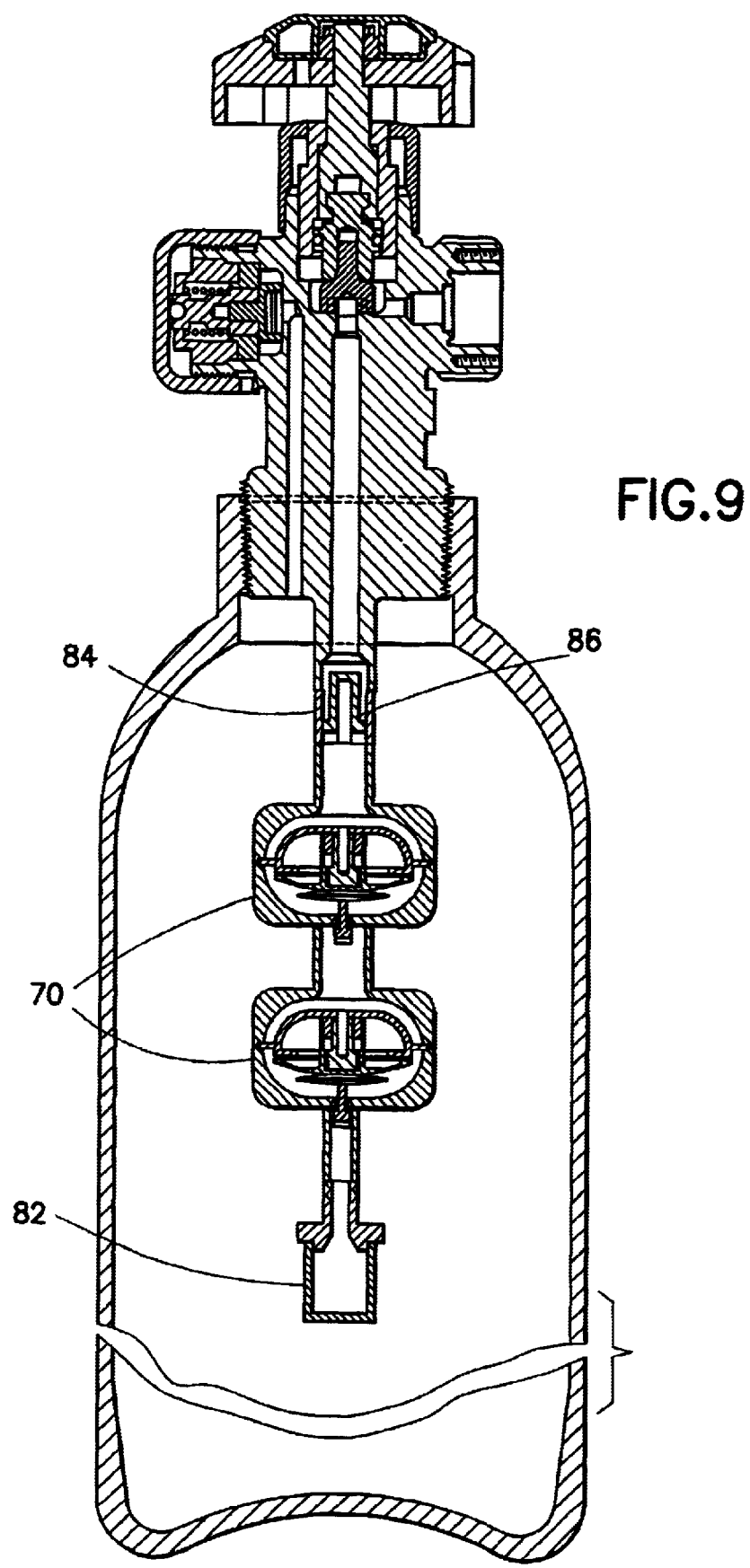
FIG. 9 is a cross-section view showing a fluid delivery and gas dispensing system having a multistage regulator system comprising two regulators.

In the fluid storage and dispensing system described herein, the pressure regulator 70 may suitably comprise a double stage regulator system, as shown in FIG. 9, to eliminate the possibility of leakage during horizontal storage of the system. Specifically, if the storage and dispensing vessel utilizes a single stage regulator in combination with a phase-separator unit, the vessel if reposed on its side may contain sufficient liquid so that the liquid volume extends above the height of the permeable phase-separator membrane. Under such condition, liquid will condense on the valve side of the membrane until the respective liquid levels on the opposing sides of the membrane have equalized.

The use of a double stage regulator system obviates such shortcoming. If fluid from the bulk interior volume of the vessel moves between the first and second stage regulators of the double stage regulator system, the pressure-sensitive element of the high-pressure stage second regulator (the high-pressure stage being the stage of the regulator in initial fluid flow communication with the liquid in the vessel, and the low-pressure stage first regulator being the stage of the regulator in subsequent fluid flow communication to the second stage) will be forced to a closed position. Typically, the pressure-sensitive element of the first and second regulators is a poppet valve. As the high-pressure stage is forced closed and the pressure in the interstage region (between the high-pressure stage and the low-pressure stage) rises, such increased interstage pressure will have little impact on the final pressure of the fluid discharged from the second stage.

The pressure set point for the high-pressure stage (second) regulator can be set to any suitable pressure level above the pressure of the final stage (low-pressure stage) of the dual stage regulator. By such arrangement, the liquid condensation issue of the single stage regulator arrangement is resolved, without impact on the overall operation of the fluid storage and dispensing system, including the fill operation (fluid charging) of such system.

The storage and dispensing system utilizing a dual stage regulator system may be configured as generally shown in FIG. 9 wherein the double-stage fluid pressure regulator is associated with the port of the vessel, and is arranged to maintain a predetermined pressure in the interior volume of the vessel.

The first and second regulators may be joined to one another in any suitable manner, as for example by coupling or fitting means, by adhesive bonding, welding, brazing, soldering, etc., or the first and second regulators may be integrally constructed as components of a dual regulator assembly.

The gas pressure regulator devices useful in the broad practice of the invention can be of any suitable type. Preferred regulators include the Swagelok® HF series of set pressure regulators (commercially available from Swagelok Company, www.swagelok.com), having a set point pressure in a range of from vacuum levels to pressures on the order of 2550 psig. The use of high-precision regulators permits gas to be reliably dispensed from the vessel containing the interior regulator, at the desired set point pressure level.

The second regulator, at its lower end, may be joined to high efficiency particle filter 82. The high efficiency particle filter 82 serves to prevent contamination of the regulator elements and upstream valve elements with particulates or other contaminating species that otherwise may be present in the fluid flowed through the regulators and valves in the operation of the apparatus.

The embodiment shown in FIG. 9 also has a high efficiency particle filter 86 disposed in the extension tube 84, to provide further particulate removal capability, and to ensure high gas purity of the dispensed gas.

As a further modification, the particulate filters may be coated or impregnated with a chemisorbent that is selective for impurity species present in the gas to be dispensed (e.g., decomposition products deriving from reaction or degradation of the gas in the vessel). In this manner, the gas flowing through the particulate filter is purified in situ along the flow path as it is dispensed.

Another aspect of the invention relates to a fluid storage and dispensing system comprising a vessel containing a physical adsorbent material with sorptive affinity for a gas, e.g., a gas selected from the group consisting of hydride gases, halide gases and organometallic compound gases. A gas of such type (i.e., one for which the physical adsorbent material has a sorptive affinity) is contained in the vessel at an internal vessel pressure of from about 50 to about 5000 pounds per square inch gauge (psig). Preferably, from about 5 to about 40% of such gas is present in a free (unadsorbed) state and from about 60 to about 95% of such gas is present in an adsorbed state on the physical sorbent material.

The vessel in which the adsorbent material is contained may be constructed and arranged with a dispensing assembly or other discharge means, as described in U.S. Pat. No. 5,518,528, issued May 21, 1996 in the names of Glenn M. Tom and James V. McManus, the disclosure of which hereby is incorporated herein by reference in its entirety. The vessel may alternatively be constructed as shown in FIG. 3 hereof, but wherein the fluid 62 is replaced by a bed of physical adsorbent material sorptively retaining a gas species that also is present in the interstices of the physical adsorbent bed as well as in the head space in the interior volume of the vessel.

The following examples demonstrate the effectiveness of the static method as a contaminate cleaning process for the removal of solid residues from the interior chamber of a vacuum processing chamber in the practice of the present invention.

EXAMPLE 1

Figure 4:
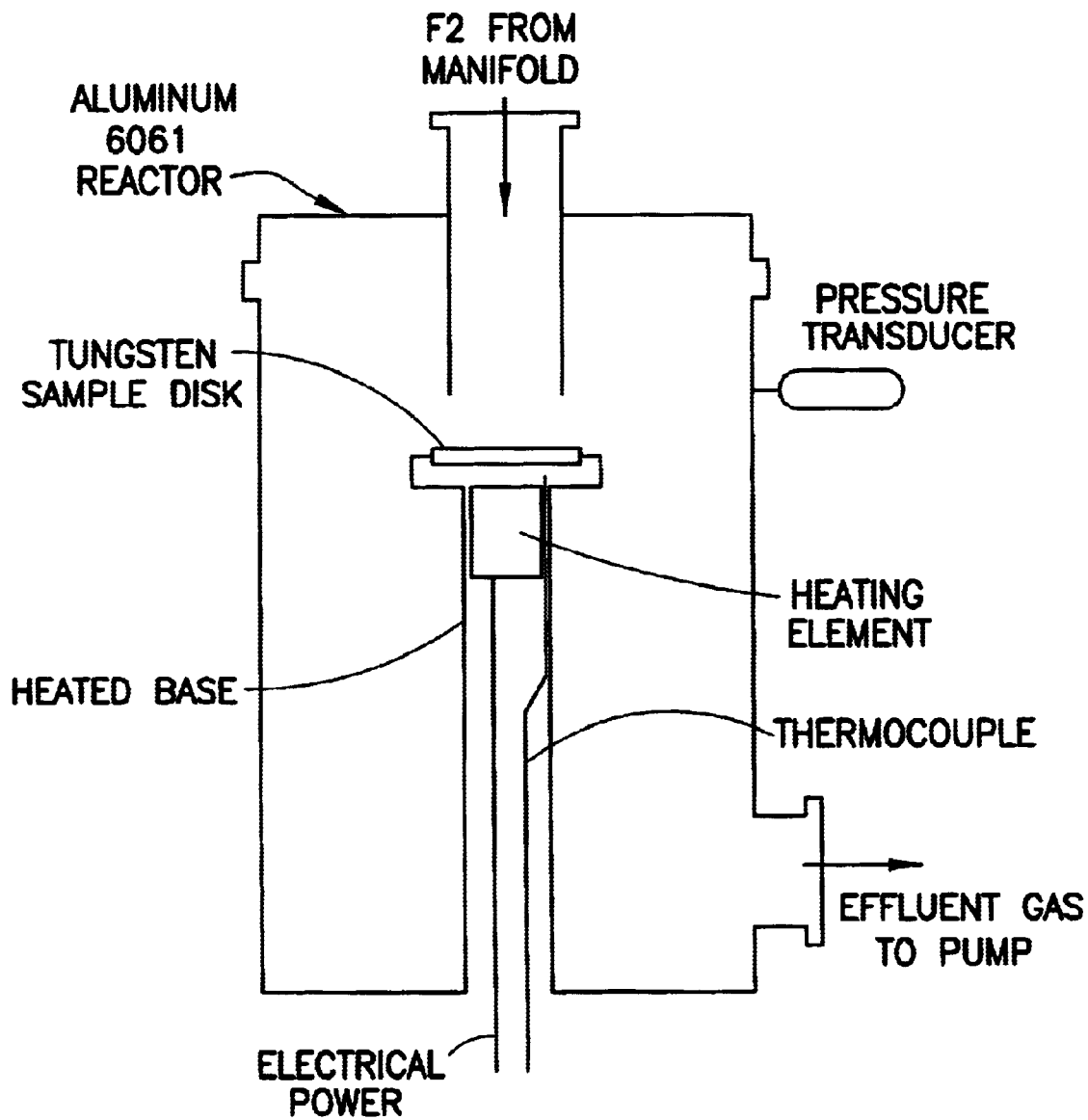
FIG. 4 is a diagram schematically showing a CVD Reactor.

Experiments were performed to dry etch a sample of a tungsten (W) material using cleaning methods of the prior art and the present invention. An aluminum reactor, having a 2 liter volume, was used as a processing chamber. A one inch solid tungsten wafer was placed in the interior of the chamber on a pedestal, as shown in FIG. 4. Molecular fluorine ($F_2$) was introduced into the reactor by two separate methods:

1) the continuous flow mode of the prior art;
2) the static flow mode of the present invention.

Continuous Flow Method of the Prior Art

The aluminum reactor was evacuated using a dry pump and the pump effluent gases were monitored for gaseous reaction products formed between the surface deposits and introduced halogenated substances. The etch rates and fluorine gas utilization were measured as a function of reactor temperature, from 300 to 400° C., and pressure, from 10 to 100 torr, and fluorine gas flow rates from 0.5 to 3 slpm. Several samples were removed during the testing and analyzed using a $WF_6$ calibrated FT-IR spectrometer to identify concentrations of gaseous reaction products, such as $WF_6$. Etch rates were determined by both measuring the time it took to remove a known weight of tungsten metal and by converting measured $WF_6$ concentrations into real-time tungsten etch rates. Etch rates and percent fluorine utilization are summarized and shown below in Table 1.

TABLE 1

| Test File | | Etch Rate mg/min | Etch Rate microns/min | F2 Utiliz % |
|---|---|---|---|---|
| Temperature Dependence (P = 10 torr, F2 f.r. = 1.1 slpm, Disks) | | | | |
| | Temperature C | | | |
| 300-1-10 | 300 | 348.4 | 25.0 | 12.7 |
| 350-1-10-(4) | 350 | 464.0 | 33.3 | 16.7 |
| 400-1-10 (3) | 400 | 626.3 | 44.9 | 22.7 |
| Pressure Dependence (T = 400 C, F2 f.r. = 1.1 slpm, Disks) | | | | |
| | Pressure (torr) | | | |
| 400-1-10 (3) | 10.4342 | 626.3 | 44.9 | 22.7 |
| 400-1-20 | 21.1 | 700.6 | 50.3 | 25.7 |
| 400-1-50 | 51.4 | 664.8 | 47.7 | 24.6 |
| 400-1-100 | 102.8 | 847.7 | 60.8 | 31.2 |
| F2 Flow Rate Dependence (T = 400 C, Pressure = 10 torr, Disks) | | | | |
| | F2 Flow Rate (slpm) | | | |
| 400-0.5-10 | 0.53 | 439.4 | 31.5 | 33.3 |
| 400-1-10 (3) | 1.1 | 626.3 | 44.9 | 22.7 |
| 400-2-10 | 2.24 | 791.9 | 56.8 | 14.3 |
| 400-3-10 | 3.36 | 1069.8 | 76.8 | 13.0 |

As expected, etch rates increased with reactor temperature, pressure, and $F_2$ gas flow rate. Fluorine utilization was proportional to temperature and pressure and inversely proportional to $F_2$ gas delivery rate. Average $F_2$ utilization rates ranged between 13 and 33%

Static Mode

Figure 5:
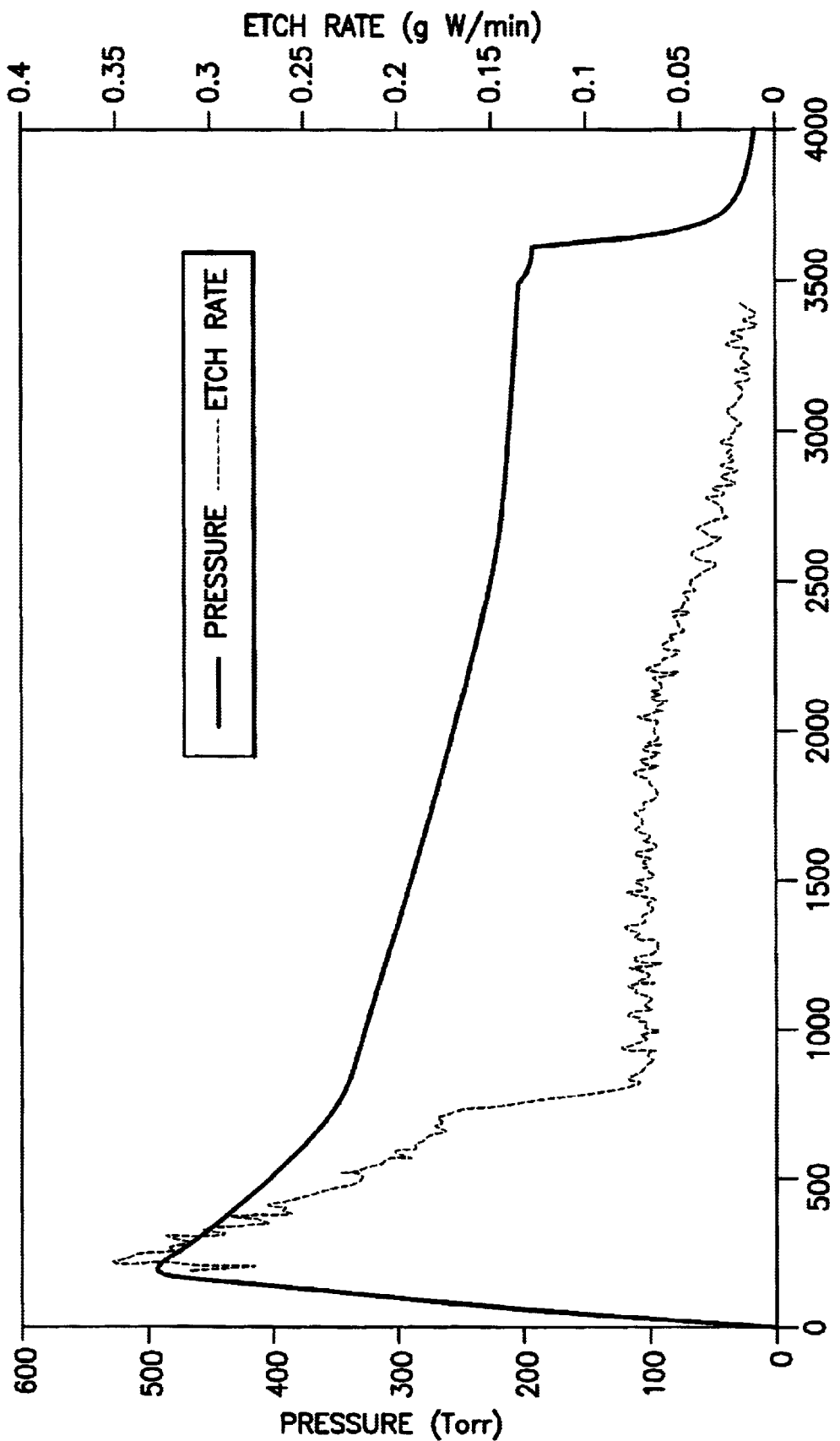
FIG. 5 is a graph showing the time dependent tungsten etch rat at 500 torr of $F_2$ pressure in a 400° C. reactor during a static clean.
Figure 6:
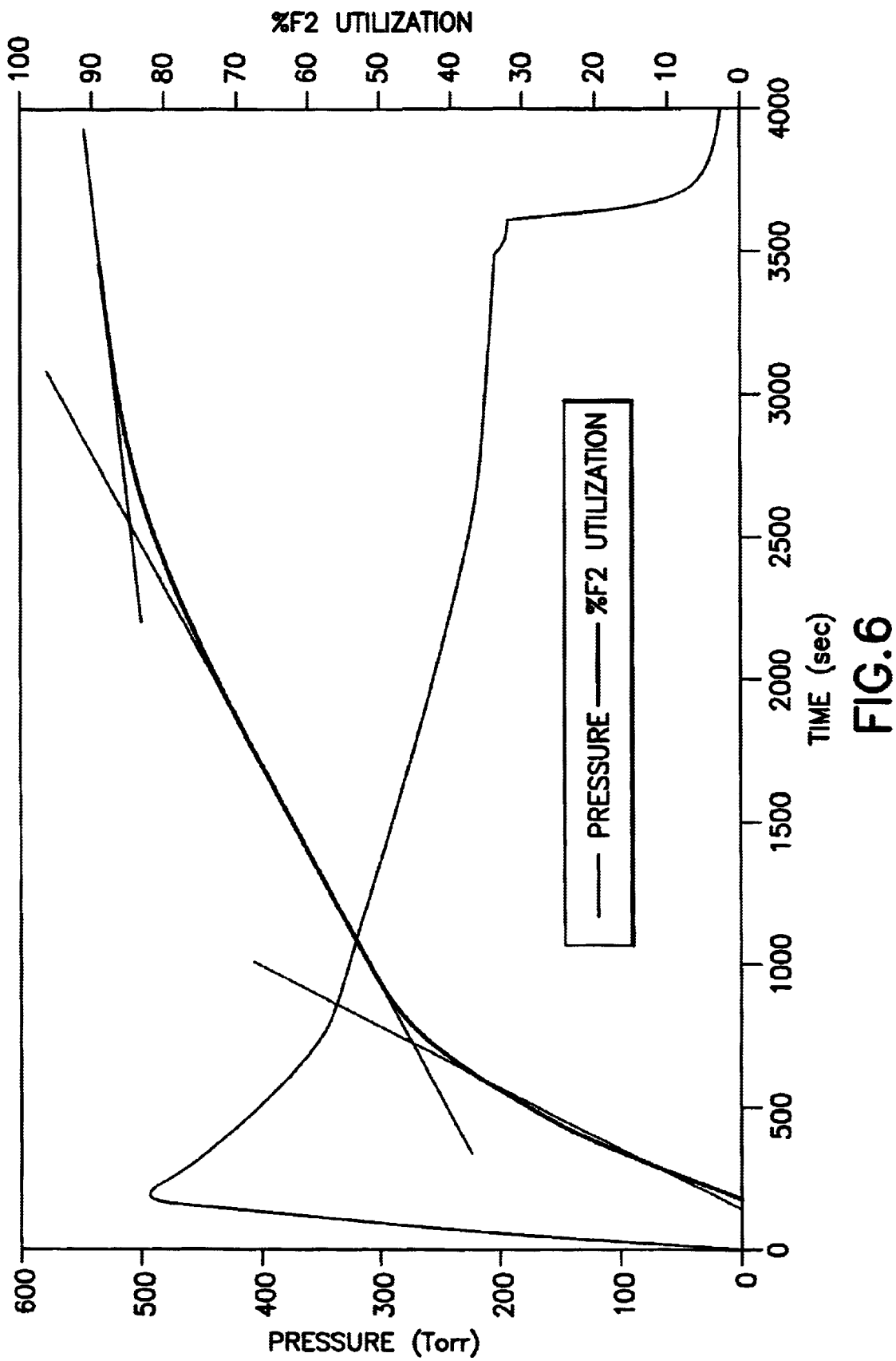
FIG. 6 illustrates the time dependent fluorine utilization percent at 500 torr of $F_2$ pressure in a 400° C. reactor during a static clean.

Tungsten metal samples were introduced into the 2 liter volume aluminum reactor. The system was then filled with molecular fluorine to a pre-set pressure and temperature. The flow of $F_2$ was terminated and maintained in the processing chamber for three minutes. During the static reaction mode, the pressure within the cylinder was monitored in order to provide a measured etch rate. After this time period elapsed, the reactor was carefully opened, and the reactor contents were vented and analyzed using the FT-IR spectrometer. FIG. 5. depicts the time dependent pressure change within the static reactor due to the reaction of fluorine with metal tungsten to form $WF_6$. In this experiment, the reactor was heated to 400° C. and then filled with 500 torr of $F_2$. The time dependent etch rate is also depicted in FIG. 5. During the first 500 seconds of the test, the etch rate dropped from 330 to 160 mg/min. Following that stage, the etch rate decreases to a level around 75 mg/min. FIG. 6 shows the same data represented in terms of $F_2$ utilization. The graph revealed a non linear $F_2$ utilization rate. Nearly 50% of the initial molecular fluorine was consumed in the first 500 seconds of the reaction. Fluorine utilization of 85 percent was achieved after 3000 seconds (30 minutes) of static clean.

Figure 7:
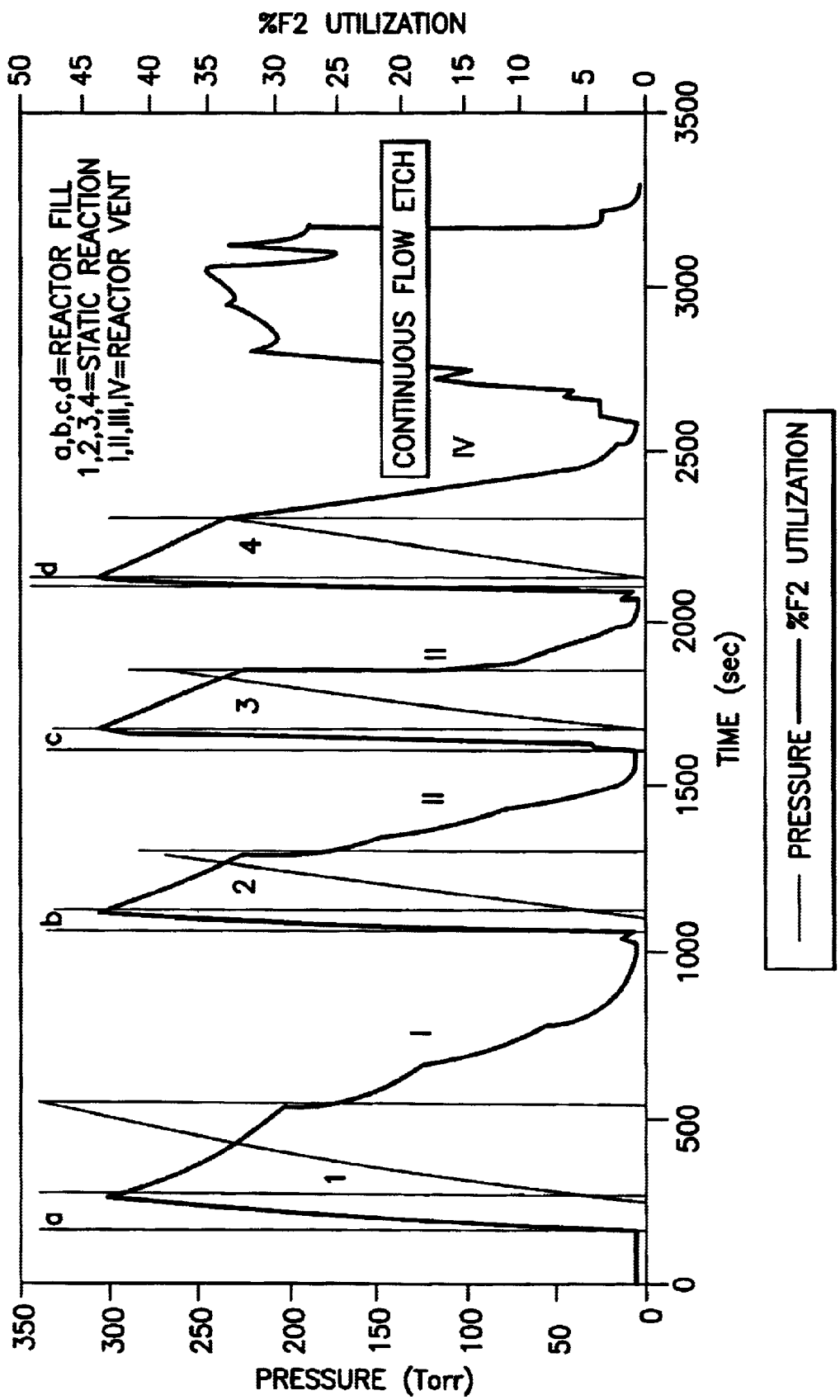
FIG. 7 is a graph showing a batch static clean with four (4) static clean cycles compared with results of a continuous flow method.

Based on this information, an experiment was designed to test the consecutive static clean concept. The goal of this invention is to accelerate etch times by using only the high-etch-rates occurring during the initial stages of the static clean. Cycles consisting of (a) 300 torr $F_2$ reactor fill, (b) static reaction, and (c) vent cycle were repeated 4 times. The static reaction times were set to 4 minutes in the initial cycle and 3 minutes for the remaining ones. The reactor temperature was fixed at 400° C. Results from this experiment are shown in FIG. 7. Tungsten etch rates remained nearly unchanged between cycles averaging 400 mg/min. Fluorine utilization of nearly 50% was achieved during the first static clean reaction cycle (4 minutes duration).

Comparative Results

A comparison was made between the test results shown in Table 1 (continuous mode) and FIG. 7 (static mode) wherein similar test parameters were used, such as pressures and wall temperature within the reactor vessel at 400° C., and approximately 200 seconds or about 3 minutes of testing.

These results indicate that static cleans can be used to achieve 50% $F_2$ utilization while only slightly compromising etch rate times. This value corresponds to a 52% improvement over the $F_2$ continuous flow method (0.5 slpm F2, 400° C., 10 torr pressure condition).

Thus, while the invention has been illustratively described herein with reference to specific elements, features and embodiments, it will be recognized that the invention is not thus limited in structure or operation, but that the invention is to be broadly construed consistent with the disclosure herein, as comprehending variations, modifications and embodiments that will readily suggest themselves to those of ordinary skill in the art.

What is claimed is:

1. A non-plasma, static method for removing tungsten deposition products from the interior surface of a chemical vapor deposition processing chamber, comprising the steps of:
   a) introducing into the interior of the processing chamber at least one reactive substance capable of effectively reacting with the tungsten deposition products, wherein the reactive substance is a gaseous halogenated substance;
   b) adjusting pressure within the processing chamber to a predetermined pressure, wherein the pressure is from about 200 torr to about 500 torr;
   c) discontinuing the flow of the reactive substance into the interior of the processing chamber;
   d) after step c), retaining the reactive substance in the processing chamber for a sufficient time for the reactive substance to react with at least a portion of the tungsten deposition products to form at least one gaseous halogenated tungsten reaction product; and
   e) removing from the interior of the processing chamber the at least one gaseous halogenated tungsten reaction product and any remaining unreacted substance.

2. The method according to claim 1 wherein the gaseous halogenated substance is selected from the group consisting of $F_2$, $Cl_2$, $Br_2$, HF, HCl, HI, HBr, ClF, BrF, BrCl, ICl, IBr, $ICl_3$, $BrF_5$, $BrF_3$, $ClF_3$, $IF_5$, $IF_7$, $XeF_2$, $NF_3$, $SF_6$, $SiCl_4$, $CF_4$, $C_2F_6$, $C_3F_8$ and combinations thereof.

3. The method according to claim 1 wherein the step of introducing the gaseous halogenated substance includes introducing same from a fluid storage system comprising:
   a) a fluid storage and dispensing vessel enclosing an interior volume for holding a fluid, wherein the vessel includes a fluid port;
   b) a fluid dispensing assembly coupled in fluid flow communication with the port;
   c) at least one fluid pressure regulator and associated with the port, and arranged to maintain a predetermined pressure of gas discharged from the vessel, deriving from fluid in the interior volume of the vessel; and
   d) the fluid dispensing assembly comprising a flow control element which is selectively actuatable to flow gas, deriving from the fluid in the interior volume of the vessel, through the fluid pressure regulator, and the fluid dispensing assembly, for discharge of the gas from the vessel.

4. The method according to claim 3 wherein the fluid pressure regulator is a multistage pressure regulator system comprising two regulators.

5. The method according to claim 3 wherein the fluid pressure regulator is positioned interiorly in the vessel.

6. The method according to claim 3 further comprising introducing a mixture of gases comprising the gaseous halogenated substance and an inert gas.

7. The method according to claim 3 further comprising introducing a mixture of gases comprising the gaseous halogenated substance and an oxidant gas, wherein the oxidant gas is selected from the group consisting of $O_2$, $O_3$, $H_2O$ and $H_2O_2$.

8. The method according to claim 3 further comprising introducing a mixture of gases comprising the gaseous halogenated substance, an inert gas and an oxidant gas.

9. The method according to claim 1 wherein the processing chamber has a pre-set temperature from about 250° C. to about 600° C.

10. The method according to claim 1 wherein the gaseous halogenated substance is introduced in a sufficient amount to adjust pressure within the processing chamber to the predetermined pressure level.

11. The method according to claim 10 wherein the predetermined pressure is at a preset temperature.

12. The method according to claim 1 further comprising venting the processing chamber after discontinuing the introduction of reactive substance to remove reaction products.

13. The non-plasma, static method according to claim 1, further comprising repeating the cycle of steps (a) to (e) multiple times, wherein each performance of step (d) is conducted for approximately 500 seconds.

14. A method for controlling solid tungsten residue during chemical vapor deposition processing of a workpiece, comprising:

a) providing a processing apparatus including a processing chamber and a source of energy, b) introducing a semiconductor workpiece into the processing chamber;

c) introducing a reactive gas into the processing chamber suitable for forming solid tungsten residues for deposition on the workpiece and interior surfaces of the processing chamber;

d) supplying energy in a sufficient amount to generate vapor deposition conditions;

e) removing the workpiece from the processing chamber; and f) cleaning the interior chamber by the steps comprising:
   i) introducing into the interior of the chamber at least one gaseous halogenated reactive substance that is reactive with the solid tungsten residue, the gaseous halogenated reactive substance being introduced in a sufficient amount to increase pressure within the processing chamber to a pressure from about 200 torr to about 500 torr;
   ii) terminating the introduction of the gaseous halogenated reactive substance into the interior of the processing chamber;
   iii) after step ii), retaining the gaseous halogenated reactive substance in the processing chamber for a sufficient time to react with the solid tungsten residue to form at least one gaseous halogenated tungsten reaction product; and
   iv) removing from the interior of the processing chamber the gaseous halogenated tungsten reaction product and any remaining gaseous halogenated reactive substance.

15. The method according to claim 14 wherein the halogenated substance is selected from the group consisting of $F_2$, $Cl_2$, $Br_2$, HF, HCl, HI, HBr, ClF, BrF, BrCl, ICl, IBr, $ICl_3$, $BrF_5$, $BrF_3$, $ClF_3$, $IF_5$, $IF_7$, $XeF_2$, $NF_3$, $SF_6$, $SiCl_4$, $CF_4$, $C_2F_6$, $C_3F_8$ and combinations thereof.

16. The method according to claim 14 wherein the step of introducing the gaseous halogenated substance is introduced by a fluid storage system comprising:
   a) a fluid storage and dispensing vessel enclosing an interior volume for holding a fluid, wherein the vessel includes a fluid port;
   b) a fluid dispensing assembly coupled in fluid flow communication with the port;
   c) a fluid pressure regulator and associated with the port, and arranged to maintain a predetermined pressure of gas discharged from the vessel, deriving from fluid in the interior volume of the vessel; and
   d) the fluid dispensing assembly comprising a flow control element which is selectively actuatable to flow gas, deriving from the fluid in the interior volume of the vessel, through the fluid pressure regulator, and fluid dispensing assembly, for discharge of the gas from the vessel.

17. The method according to claim 16 wherein the fluid pressure regulator is a double-stage pressure regulator system comprising two regulators.

18. The method according to claim 16 wherein the fluid pressure regulator is positioned interiorly in the vessel.

19. The method according to claim 14 wherein the processing chamber has a pre-set temperature from about 250° C. to about 600° C.

20. The method according to claim 14 wherein the gaseous halogenated substance is introduced in a sufficient amount to adjust pressure within the processing chamber to the predetermined pressure level.

* * * * *